(12) United States Patent
Trotta

(10) Patent No.: US 8,598,926 B2
(45) Date of Patent: Dec. 3, 2013

(54) ELECTRICAL CIRCUIT HAVING A CONTROLLABLE OSCILLATOR

(75) Inventor: Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 13/370,973

(22) Filed: Feb. 10, 2012

(65) Prior Publication Data

US 2013/0207700 A1    Aug. 15, 2013

(51) Int. Cl.
*H03L 7/06* (2006.01)

(52) U.S. Cl.
USPC .......................................... 327/157; 327/148

(58) Field of Classification Search
USPC ................................................ 327/148, 157
See application file for complete search history.

(56) References Cited

U.S. PATENT DOCUMENTS

| | | | |
|---|---|---|---|
| 6,967,539 B2* | 11/2005 | Beylor et al. | 331/74 |
| 2004/0100338 A1 | 5/2004 | Clark | |
| 2006/0164141 A1* | 7/2006 | Self | 327/158 |
| 2008/0303564 A1* | 12/2008 | Feng | 327/153 |
| 2010/0060332 A1* | 3/2010 | Song et al. | 327/156 |
| 2012/0105119 A1* | 5/2012 | Kim et al. | 327/158 |

FOREIGN PATENT DOCUMENTS

WO    WO 2004/045090 A2    5/2004
WO    WO 2008/040335 A1    4/2008

* cited by examiner

*Primary Examiner* — Adam Houston
(74) *Attorney, Agent, or Firm* — Slater & Matsil, L.L.P.

(57) ABSTRACT

An electrical circuit including a controllable oscillator, a transmission line and a control loop. The controllable oscillator is configured to generate an oscillating signal. The transmission line is connected to an output of the oscillator, wherein the transmission line has a length which is a fraction of a wavelength of the oscillating signal. The control loop is configured to detect a difference between a first value of a signal parameter of the oscillating signal and a second value of the signal parameter of the oscillating signal having passed the transmission line. Furthermore, the control loop is configured to control the controllable oscillator in accordance with the difference.

26 Claims, 8 Drawing Sheets

"PRIOR ART"

ELECTRICAL CIRCUIT HAVING A CONTROLLABLE OSCILLATOR

TECHNICAL FIELD

Embodiments of the invention refer to an electrical circuit comprising a controllable oscillator for controlling same and a method for controlling a controllable oscillator.

BACKGROUND

An oscillator generates an oscillating signal, e.g. an alternating current (AC), at a selected frequency. The frequency of the oscillating signal is typically locked to a reference frequency. Here, a so called voltage-controlled-oscillator may be used in connection with a phase lock loop. A phase lock loop is a control system that generates a control signal or a voltage Vtune, whose phase is related to the phase of an external reference signal. The phase lock loop compares the phase of the reference signal with the phase of the signal delivered from the oscillator and adjusts the frequency of same to keep the phases matched. The stable frequency of the reference signal is usually running at a much lower frequency compared to the frequency generated by the oscillator. Therefore, the frequency of the oscillator is down converted in order to be compared with the reference frequency. A typical application of such a phase locked oscillator is a transmitter configuration of a radar system or a communication device, wherein the oscillating signal may be modulated to generate a transmitter signal.

SUMMARY OF THE INVENTION

One embodiment provides an electrical circuit comprising a controllable oscillator, a transmission line and a control loop. The controllable oscillator is configured to generate an oscillating signal. The transmission line is connected to an output of the oscillator, wherein the transmission line has a length which is a fraction of a wavelength of the oscillating signal. The control loop is configured to detect a difference between a first value of a signal parameter of the oscillating signal and a second value of the signal parameter of the oscillating signal having passed the transmission line, and to control the controllable oscillator in accordance with the difference.

A further embodiment provides an electrical circuit comprising a controllable oscillator configured to generate an oscillating signal and a transmission line connected to an output of the oscillator, wherein the transmission line having a length which is a fraction of a wavelength of the oscillating signal. The electrical circuit further comprises a control loop comprising a mixer (or phase detector), which is connected to an input port and an output port of the transmission line, and a control circuit. The mixer is configured to combine the oscillating signal tapped from the input port with the oscillating signal tapped from the output port such that a (phase) difference between a first value of a signal parameter of the oscillating signal and a second value the signal parameter of the oscillating signal having passed the transmission line is detectable. The control circuit is configured to control the controllable oscillator in accordance with the difference via a control signal.

A further embodiment provides an electrical circuit comprising a controllable oscillator, which is configured to generate an oscillating signal, and a transmission line connected to an output port of the oscillator, wherein the transmission line has a length which is a fraction of a wavelength of the oscillating signal. The electrical circuit further comprises a control loop comprising a mixer, which is connected to an input port and an output port of the transmission line, and a control circuit. Furthermore, the electrical circuit comprises a calibration circuit comprising a lookup table and a digital-to-analog converter. The digital-to-analog converter is configured to output a calibration signal to the mixer in accordance with calibration data stored in the look-up table. The mixer is configured to combine the calibration signal, the oscillating signal tapped from the input port and the oscillating signal tapped from the output port such that a difference between a first value of a phase of the oscillating signal and a second value of the phase of the oscillating signal having passed the transmission line is detectable. The control circuit is configured to control the controllable oscillator in accordance with the difference via a control signal.

A further embodiment provides an electrical circuit comprising a controllable oscillator configured to generate an oscillating signal and means for transmitting the oscillating signal through a transmission line such that a signal parameter of the oscillating signal is changed. The electrical circuit further comprises a control loop configured to detect a difference between a first value of the signal parameter and a second value of the signal parameter, and to control the controllable oscillator in accordance with the difference.

A further embodiment provides a method for controlling a controllable oscillator which is configured to generate an oscillating signal. The method comprises the step of transmitting the oscillating signal through a transmission line which is connected to an output of the oscillator, wherein a length of the transmission line is a fraction of a wavelength of the oscillating signal. Furthermore, the method comprises the step of detecting a difference between a first value of a signal parameter of the oscillating signal and a second value of the signal parameter of the oscillating signal having passed the transmission line. The next step is controlling the controllable oscillator in accordance with the difference.

BRIEF DESCRIPTION OF THE DRAWINGS

Embodiments of the present invention will be explained below in more detail with reference to the figures, wherein:

FIG. 2, show a schematic block diagram of an electrical circuit comprising an oscillator, a transmission line and a control loop according to an embodiment;

FIG. 5b schematically shows a diagram of a frequency over time for illustrating the mode of operation of the linearization circuit according to FIG. 5a.

DETAILED DESCRIPTION OF ILLUSTRATIVE EMBODIMENTS

Figure 1:
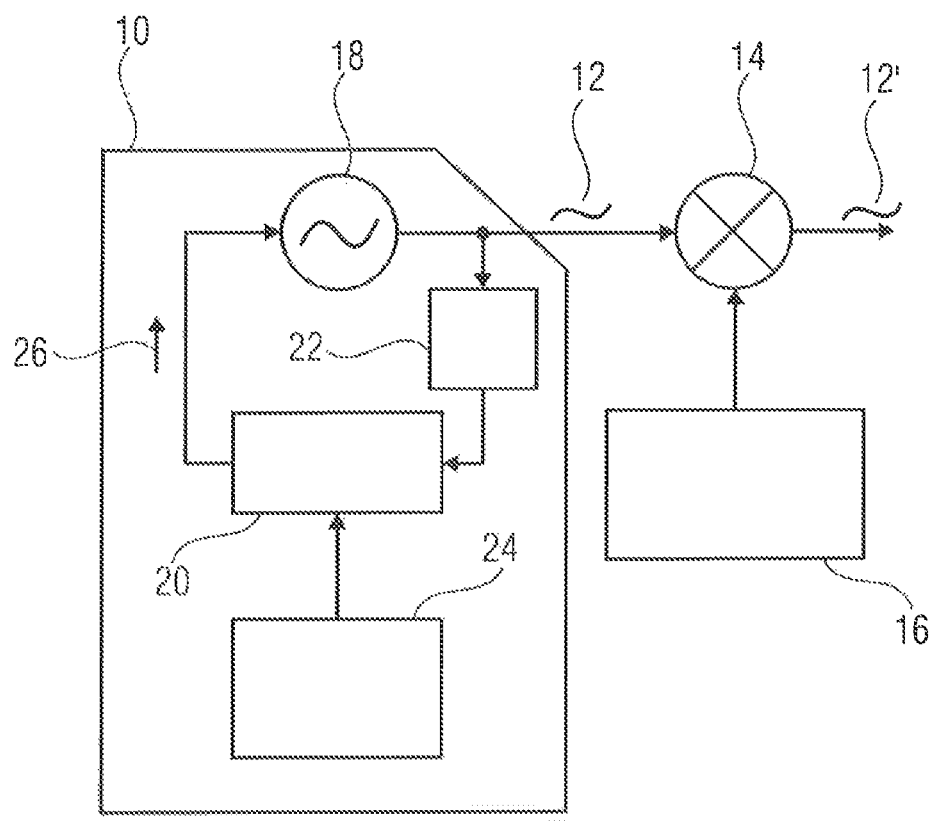
FIG. 1 shows a conventional oscillator having a phase lock loop.

Different embodiments of the present invention will subsequently be discussed referring to FIG. 1 to FIG. 5. In advance, identical reference numerals are provided to objects having identical or similar functions so that objects referred to by identical reference numerals within the different embodiments are interchangeable and their description thereof is mutually applicable.

Embodiments of the invention will be discussed below after discussing a common design of an oscillator having a phase lock loop.

FIG. 1 shows a block diagram of an electrical circuit 10 which is configured to output an oscillating signal 12. The oscillating signal 12 may be output to a mixer 14 or an up converter in order to modulate the oscillating signal 12 by using a modulator 16 which is connected to the mixer 14. Thus, the mixer 14 is configured to output the modulated signal 12', e.g. a frequency-modulated signal (FMCW) or a phase-modulated signal (BPSK) for a transmitter.

The electrical circuit 10 comprises an oscillator 18, e.g. a frequency-controlled-oscillator, and a phase lock loop 20. The phase lock loop 20 is connected to an output of the oscillator 18 via a divider chain 22 in order to receive the oscillating signal 12. In order to close the phase lock loop 20 same is connected to a control input of the oscillator 18. Furthermore, the phase lock loop 20 is connected to a reference signal generator 24, e.g. an X-tal having a quartz. Below, the functionality of the electrical circuit 10 will be discussed.

The oscillator 18 is controlled via a control signal 26, e.g. voltage $V_{tune}$. The control signal 26 is output by the phase locked loop and results from a comparison between the oscillating signal 12 and a reference signal generated by the reference signal generator 24. The reference signal generator 24 which is usually running at a much lower frequency compared to the oscillating signal 12 generates a stable frequency (e.g. 60 MHz). Therefore, the oscillating signal 12 is down converted for the comparison. This down conversion is performed by using the divider chain 22 or an offset down converter which may be mixer based. The phase lock loop 20 adjusts the oscillating signal 12, or in more detail the frequency of the oscillating signal 12 via the control signal 26, as long as the down converted oscillating signal 12 is equal to the reference signal. As a consequence of this the electric circuit 10 and the oscillator 18, respectively, are able to output the oscillating signal 12 to the mixer 14 at a stable frequency. However, due to the down converting performed by the divider chain 22 some effects are caused. An example of such an effect is the jitter of the oscillator 18 which is scaled by the divider chain 22 or the power consumption of the divider chain 22. Another effect is that spurious oscillations of the signal generator 24 may occur. Furthermore, the signal generator 24 increases the complexity of the circuit due to the fact that such a signal generator 24 typically requires an external quartz. Therefore, there is the need for an improved approach. This improved approach will be discussed referring to FIG. 2 to FIG. 5.

Figure 2A:
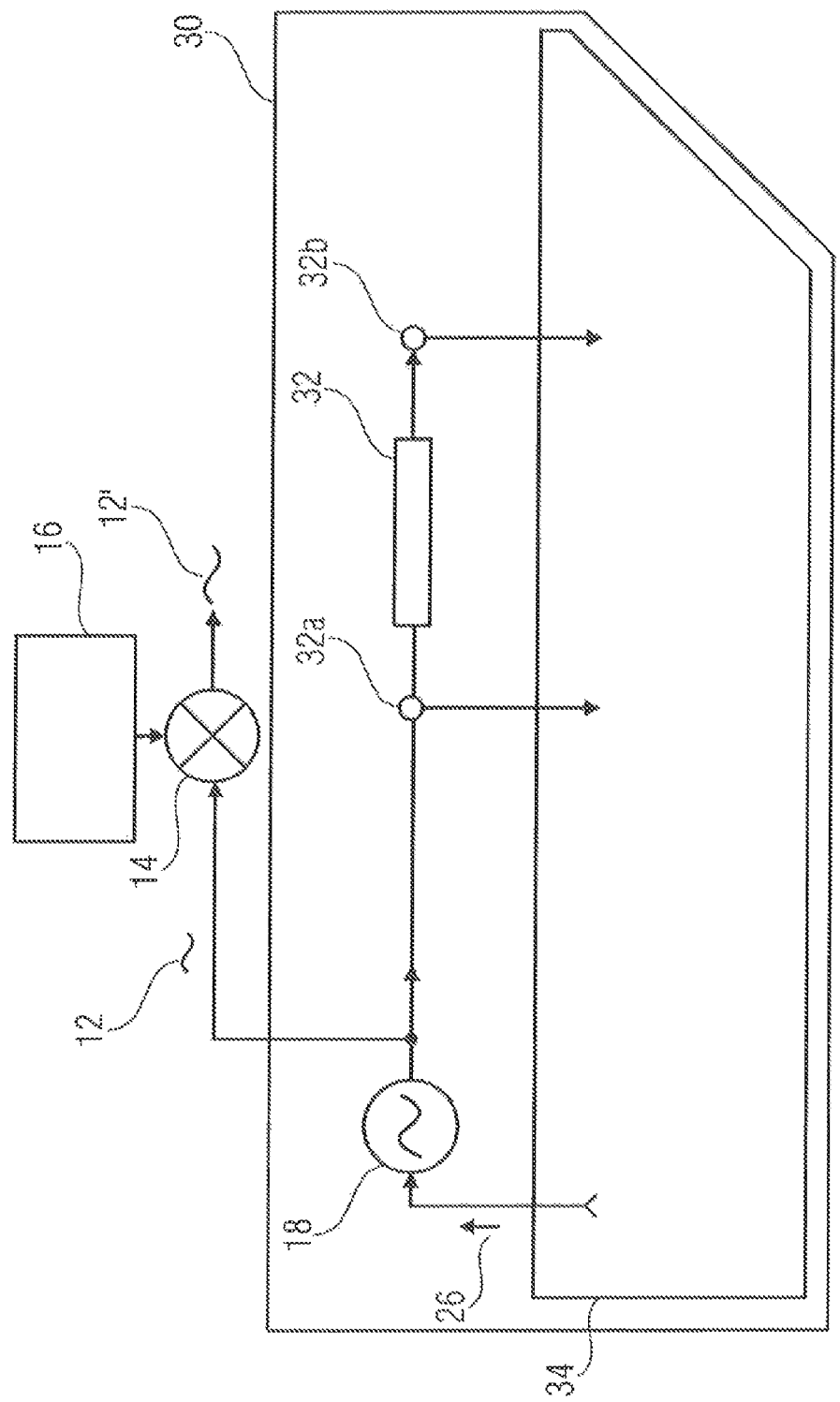
FIGS. 2a and 2b, collectively

FIG. 2a shows a block diagram of an electrical circuit 30 which comprises the oscillator 18, a transmission line 32 and a control loop 34. The oscillator 18 is configured to output the oscillating signal 12 to the mixer 14 so that same may output the modulated oscillating signal 12' (modulated by the modulator 16), as described above.

In this first embodiment an output of the oscillator 18 is connected to an input port 32a of the transmission line 32, wherein the control loop 34 is connected to the transmission line 32 via the input port 32a and an output port 32b. The control loop 34, vice versa, is further connected to the control input of the oscillator 18 in order to control the controllable oscillator 18 via the control signal 24, as will be discussed in detail, below.

The oscillating signal 12 is transmitted through the transmission line 32, e.g. a microstrip or coplanar waveguide, which has a certain length. The length (e.g. 1.22 mm) is a fraction of a wavelength (e.g. 122 GHz) of the oscillating signal 12, wherein the wavelength is indirectly proportional to its frequency. The transmission line 32 forming a slow wave transmission line is configured to change a frequency-dependent signal parameter, e.g. a phase, of the oscillating signal 12 which passes the transmission line 32. As a consequence of this, a first value of the signal parameter, e.g. the phase, detected at the input port 32a differs from a value of the same input parameter detected at the output port 32b. Due to this dependency of the signal parameter from the frequency and from the wavelength, respectively, the difference between the first and the second value may be used for controlling the oscillator 18. That means that the transmission line 32, or to be more precise a parameter of the transmission line 32, namely its length, is frequency-determining so that the transmission line 32 represents the reference for the oscillating signal 12. In order to use this effect the control loop 34 is configured to detect the difference between the first and the second value of the signal parameter, for example by a direct comparison. This detected difference provides the basis for the control signal 26.

To sum up, embodiments of the invention are based on the principle that the transmission line 32 or a frequency-related parameter of same may be used as a frequency reference. Thus, the control loop 34 compares the oscillating signal 12 output by the oscillator 18 with the same signal influenced by the transmission line 32. This comparison enables a control of the frequency of the oscillating signal 12 and thus locking the oscillator 18 at a selected frequency of interest. This way to control the frequency of the oscillating signal 12 may especially be used for high frequencies, e.g. 122 GHz (or in a range between 50 to 250 GHz), because with the increase of the frequency, the (metal) conductive transmission line 32 becomes more and more short so that same may be implemented on a single chip. Further, this electrical circuit 30 does not require a divider chain, so the signal parameter is directly compared to the fundamental (not down converted) frequency of the oscillating signal 12 and not to its divided version. This is beneficial with respect to phase effects like jitter. Furthermore, it is advantageous that the complexity of the electrical circuit 30 is reduced due to the missing external reference signal generator. This may have positive effects to the power consumption of a front-end for smart or small sensor systems, wherein it relies on the performance of the phase comparator.

It should be noted that not only the length of the transmission line 32 influences the oscillating signal 12. Other factors of influence are a dielectric or geometry of a metal stack of the transmission line 32 implemented on a chip. However, starting from a given frequency of interest the length of the transmission line 32 may be defined dependent on the geometry and the dielectric constant $\in_r$. For example, on silicon the length of the transmission line may correspond to the wavelength of the oscillating signal 12 or to a fraction, e.g. the half, a quarter or a double of same.

Figure 2B:
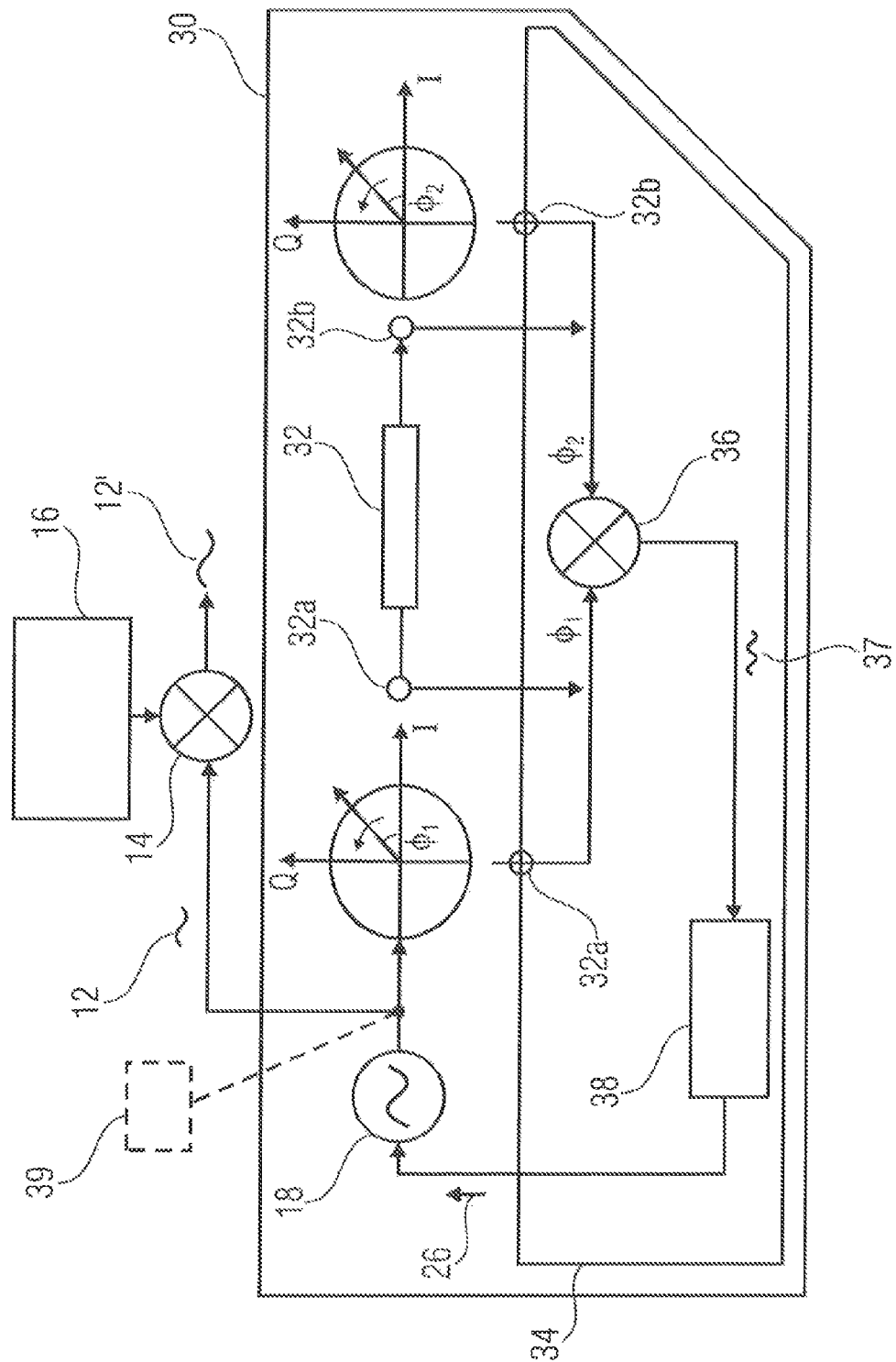

FIG. 2b shows a further embodiment of an electrical circuit having a voltage controlled oscillator 18 (VCO) which substantially corresponds to the electrical circuit 30 of FIG. 2a. Here, the control loop 34 is configured to detect a phase difference $\Delta\phi$ of the oscillating signal 12 between the phase $\phi_1$ tapped from the input port 32a and the phase $\phi_2$ tapped from the output port 32b. The two different phases $\phi_1$ (before passing the transmission line 32) and $\phi_2$ (after passing the transmission line 32) are illustrated by two (I/Q-) phase diagrams having a real and complex component. In order to detect the phase difference $\Delta\phi$ between the phase $\phi_1$ and the phase $\phi_2$ the control loop 34 comprises a control circuit 38 and a mixer 36 or, in general, a phase detector 36. The mixer 36 (or phase detector 36) is connected to the input port 32a and to the output port 32b for receiving the oscillating signal before and after passing the transmission line 32, wherein the control circuit 38 is arranged between an output of the mixer 36 and the input port of the oscillator 18.

The mixer 36 used as phase comparator combines the oscillating signal tapped from the input port 32a with the same signal tapped from output port 32b by a multiplication or a summation and outputs a combined signal 37, for example, in the voltage domain. It should be noted that the oscillating signal 12 tapped from output port 32b is delayed compared to the oscillating signal tapped from input port 32a. This delay results from a phase shift $\Delta\phi$ while passing the transmission line 32. For example, the phase difference $\Delta\phi$ may exactly amount to 0° (360°), when the oscillator 18 is locked to the frequency of interest or if the length of the transmission line 32 is equal to the wavelength of the oscillating signal 12. If the oscillator 18 has a different frequency compared to the frequency of interest, the value of the phase difference $\Delta\phi$ is larger than 0°.

The combined signal 37 comprises information about the phase difference $\Delta\phi$, or in general information on the detected difference. The combined signal 37, for example, an AC voltage (having a doubled frequency compared to the oscillating signal 12) is available such that the control circuit 38 is able to output the control signal 26, namely a DC voltage $V_{tune}$ (like in a standard voltage-control oscillator) to the oscillator 18. For example, the multiplication of the oscillating signals which are tapped from the input port 32a and output port 32b results in a combined oscillating signal 37 having a DC component and an AC component. The DC component is transformable to the DC voltage $V_{tune}$. This transformation is performed by the control circuit 38, for example by filtering the DC component of the combined signal 37 or by averaging the combined signal 37. Therefore, according to further embodiments the control circuit 38 may comprise a lowpass filter and/or a charge pump.

The frequency determining factors like the length of the transmission line 34 and the thickness of the oxide or the dielectric constant may vary due to process variations, so it is not possible to guarantee that the designed transmission line 34 is exactly adjusted to the expected frequency. In such cases it would be beneficial to add means for calibrating the control loop which will be explained referring to FIGS. 3a and 3b.

Figure 3A:
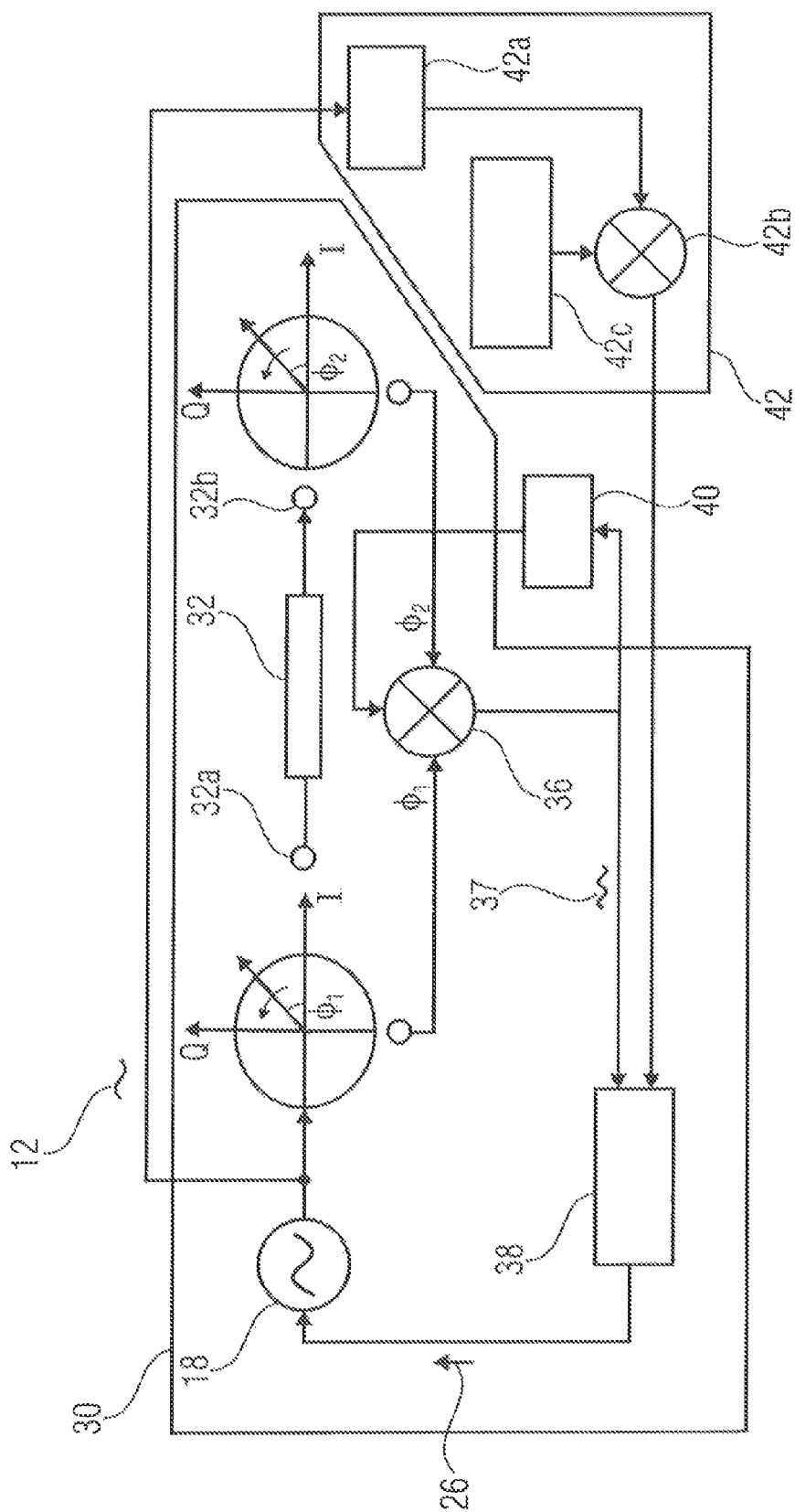
FIGS. 3a and 3b show schematic block diagrams of electrical circuits comprising an oscillator, a transmission line and a control loop as well as a calibration circuit and a calibration loop according to further embodiments.

FIG. 3a shows a block diagram of the electrical circuit 30 of FIG. 2b in combination with a calibration circuit 40 and a separated calibration loop 42. The purpose of the calibration circuit 40 is to calibrate the control signal 26 by an additional calibration signal. This calibration may be performed on the basis of calibration data detected by the calibration loop 42 and stored in a lookup table, wherein the calibration data may comprise phase information.

The calibration circuit 40 is configured to output a calibration signal, e.g. a DC voltage or a DC offset, to the mixer 36 depending on the deviation of the difference, e.g. the phase difference $\Delta\phi$, from the theoretically calculated difference. The respective deviation of the difference between the first and the second value is not necessarily linear so that the calibration circuit 40 may output a calibration signal which is dependent on the combined signal 37. In this case, the calibration circuit 40 may comprise an input having an analog-to-digital converter which is configured to analyze the combined signal 37, wherein the calibration data may comprise allocation data for providing an allocation between a respective combined signal 37 and a calibration signal to be output.

The calibration loop 42 is configured to detect the calibration data and comprises a divider chain 42a, a mixer 42b and a reference signal generator 42c, comparable to a conventional phase lock loop. The divider chain 42a (e.g. a divider chain with the value ½000) is connected to the output of the oscillator 18 and to the mixer 42b. The calibration loop 42 may optionally comprise a switch 63 via which the calibration loop 42 may be enabled and disabled, respectively, so that calibration loop 42 may only be enabled to check and calibrate the control loop 34. During the calibration, the mixer 42b combines the oscillating signal 12 down converted by the divider chain 42a with a reference signal of the reference signal generator 42c. These combined signals are output to the oscillator 18 via the control circuit 38 so that the calibration circuit 40 may detect the calibration data and store same to its lookup table.

Figure 3B:
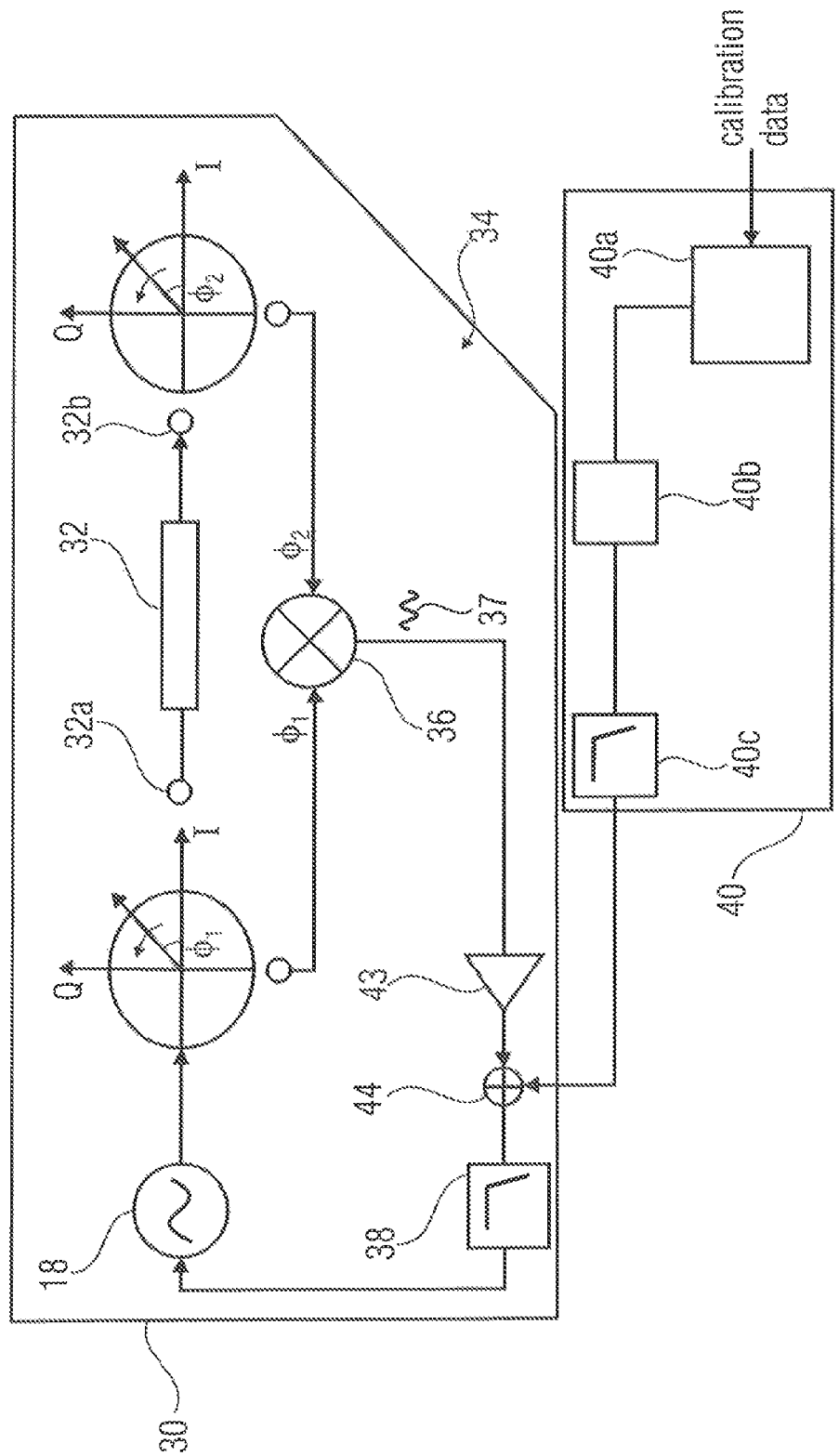

FIG. 3b shows a further embodiment of an electrical circuit 30 in combination with a calibration circuit 40. The electrical circuit 30 is equal to the electrical circuit 30 of FIG. 2b, but further comprises an additional summation circuit 44 for connecting the calibration circuit 40. The additional summation circuit 44 is arranged between the mixer 36 and the control circuit 38 formed by a lowpass filter. The calibration circuit 40 comprises a lookup table 40a, in which the calibration data are stored, a digital-to-analog converter 40b, which is configured to translate the calibration data from the lookup table 40a in the voltage domain, and a lowpass filter 40c via which the calibration signal is output. The (lowpass filtered) calibration signal, e.g. a DC voltage (also referred to as offset voltage), is added to the combined oscillating signal 37 by the additional summation circuit 44. Due to this changed control signal 26 the center frequency of the oscillating signal 12 is shifted at the expected center frequency of an ideal transmission line 32. So, the calibration circuit 40 enables taking the non-ideal transmission line 32 into account.

Figure 4:
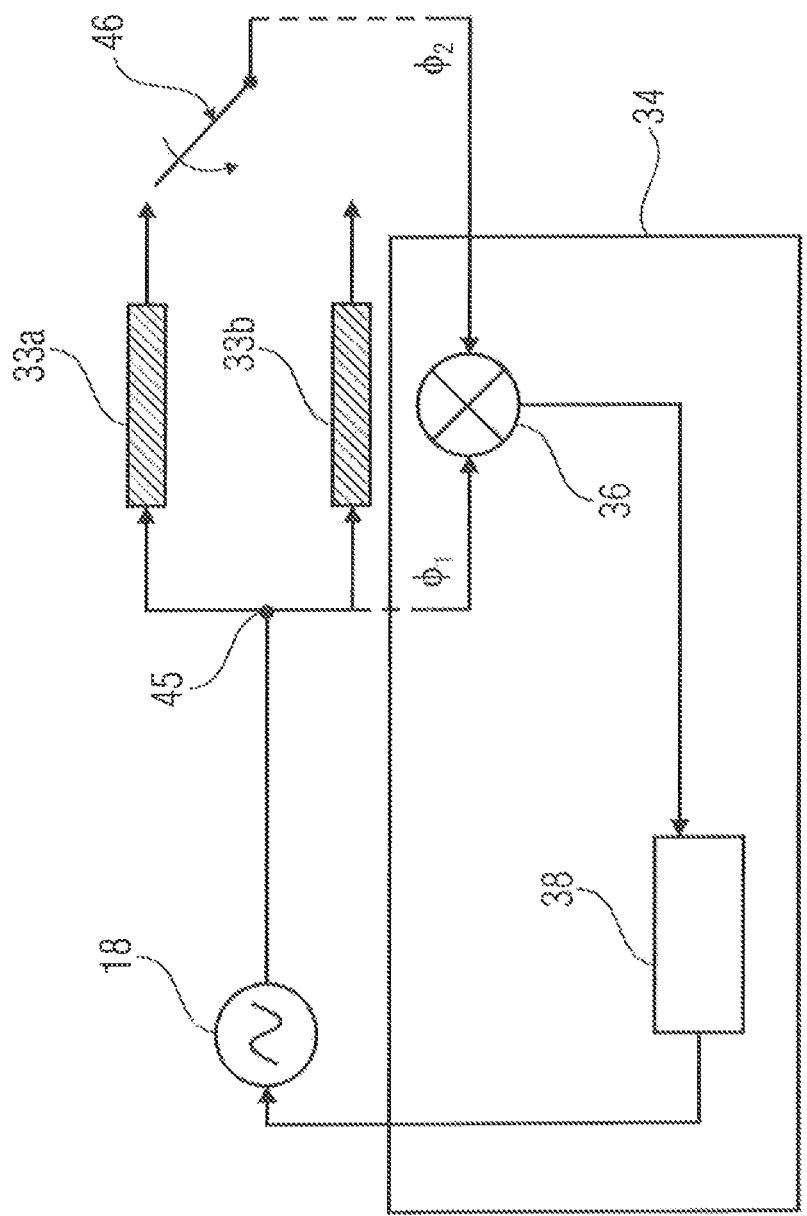
FIG. 4 shows a schematic block diagram of an electrical circuit comprising an oscillator, a plurality of transmission lines and a control loop according to an embodiment.

FIG. 4 shows the oscillator 18 in combination with the control loop 34 and a plurality of transmission lines, for example two transmission lines 33a and 33b, of different length. The transmission lines 33a and 33b are connected with their input ports with the output of the oscillator 18 and with the mixer 36 via a power divider 45. Each output port of the respective transmission line 33a or 33b may be selectively coupled to the mixer 36 via a switch 46.

As explained above, the length of the respective transmission line 33a and 33b has an influence on the frequency of the oscillating signal 12. Therefore, the frequency of the oscillating signal 12 may be changed by coupling a transmission line 33a or 33b of a different length to the mixer 36. This switching between the different transmission lines 33a and 33b for different frequencies of interest may be used for implementing a simple FSK modulator (Frequency Shift Keying) or MFCW modulator (Multi Frequency Continuous Wave). It should be noted that this principle is not limited to the illustrated two transmission lines 33a and 33b. For example, five transmission lines may be implemented so that a shifting between five frequencies, e.g. 122, 122.25, 122.5, 122.75 and 123 GHz, is enabled. Here, it is beneficial that the described circuit enables a switching between different frequencies of interest which may be adjacent to each other, even at high frequency ranges (100 GHz or more).

Figure 5A:
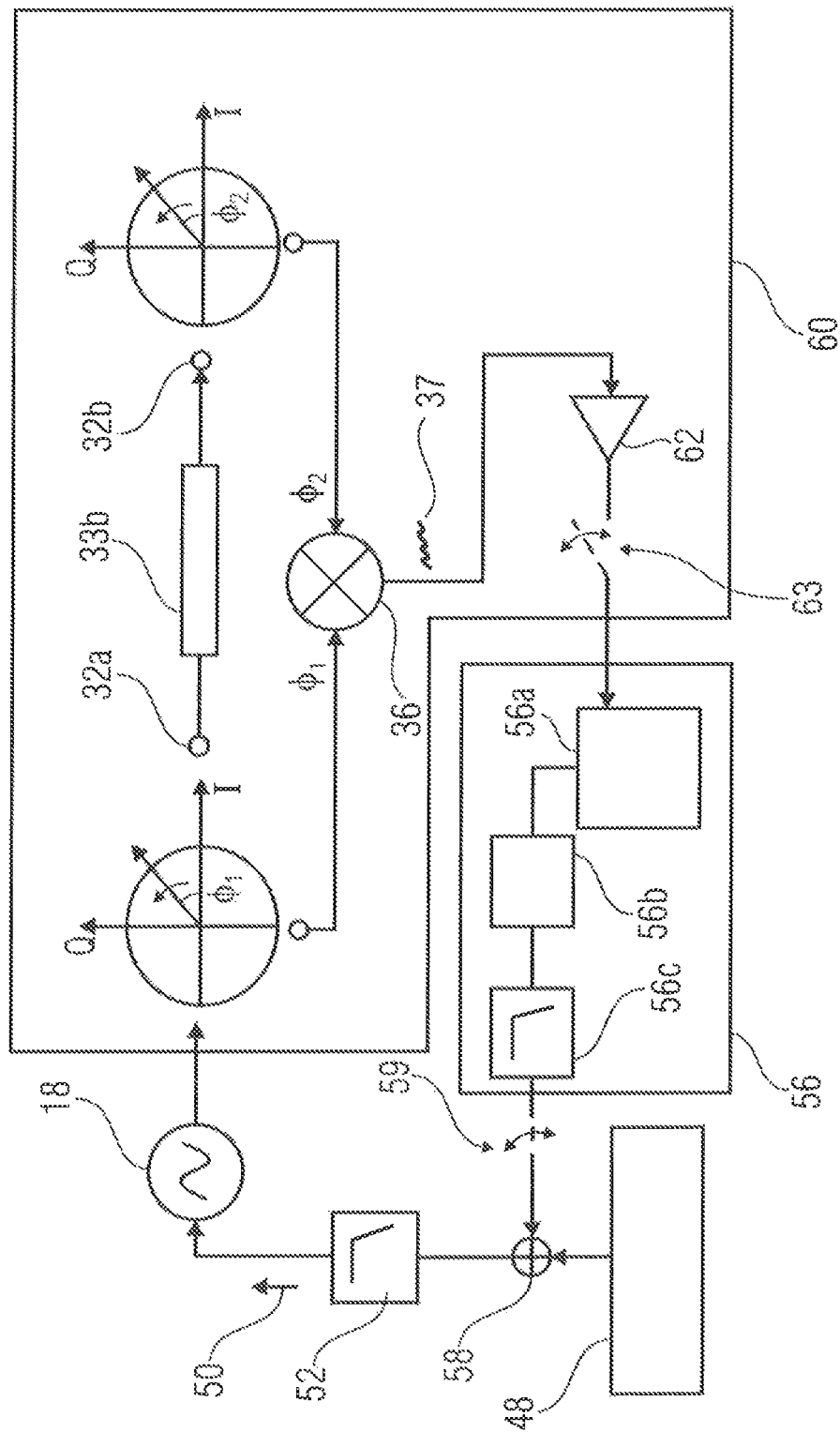
FIG. 5a shows a schematic block diagram of an electrical circuit comprising an oscillator, a transmission line and a linearization circuit according to an embodiment.
Figure 5B:
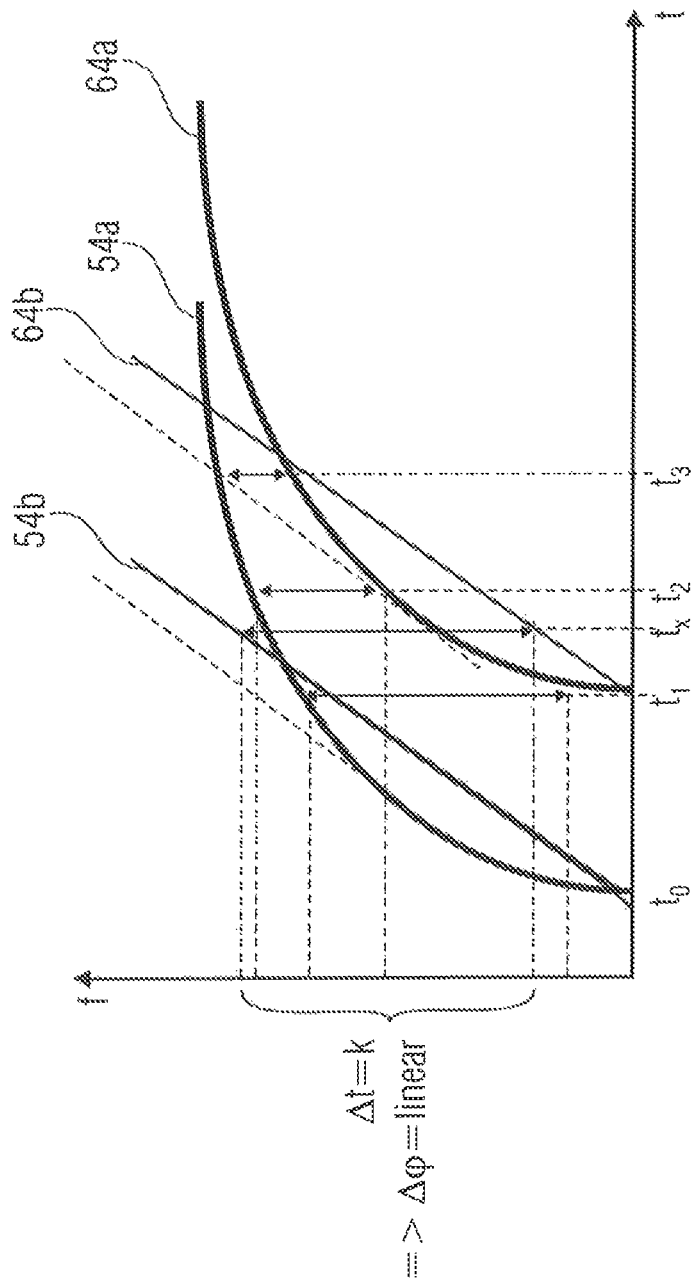

Referring to FIGS. 5a and 5b, a further embodiment of the above described electrical circuit will be described which enables to linearize a chirp signal. FIG. 5a shows an electrical circuit comprising the oscillator 18 which is configured to output the oscillating signal 12 and a ramp generator 48. The oscillator 18 is controlled by the ramp generator 48 which outputs a control signal 50, e.g. a voltage $V_{tune\ sweep}$, via a lowpass filter 52.

Such an electrical circuit may be used to output the oscillating signal 12 in the form of a chirp (varying frequency of the oscillating signal 12). The chirp or in more detail a FMCW (frequency modulated continuous wave) chirp typically has a non-linear ramp due to the non-ideal tuning characteristic of the oscillator 18, as illustrated by the graph 54a of FIG. 5b.

FIG. 5b shows a diagram of the frequency (f) plotted over time (t). Here, a resulting signal of the oscillating signal 12 is shown by a graph 54a having a non-linear ramp, when sweeping the frequency by use of the oscillator 18. The graph 54b illustrates a linear frequency ramp which should be output by the oscillator 18. Therefore, circuit described with respect to FIG. 5a comprises a linearization channel 56. The linearization channel 56 comprises a lookup table 56a for storing linearization data, a digital-to-analog converter 56b and a lowpass filter 56c. This linearization circuit 56 is coupled to the control input of the oscillator 18 via a mixer 58, which is arranged between the ramp generator 48 and the lowpass filter 52. The mixer 58 is configured to add the control signal and a linearization signal of the linearization channel 56 such that the control signal 50 or the control voltage $V_{tune\ sweep}$ is adapted.

Below, the functionality of the linearization channel 56 configured to adjust the tuning characteristic of the oscillator 18 will be discussed, which complies substantially with the functionality of the calibration circuit 40 of FIG. 3b. The linearization signal output by the digital-to-analog converter 56b via the lowpass filter 56c is used to linearize the non-linear ramp 54a such that the linear ramp 54b is generated on the basis of linearization data which may comprise some discrete points in time for linearizing the ramp 54a. The linearization is performed such that the gradient of the linear ramp 54b is equal to the gradient of the non-linear ramp 54a at a frequency of 0 Hz (cf. gradient at $t_0$). Thus, the linearization channel 56 enables most of the functionality of a so called "software phase locked loop", but having a reduced complexity. Furthermore, in contrast to the software phase lock loop, an expensive analog-to-digital converter may be saved, which is typically used to monitor the frequency at the divider output. It should be noted that the linearization channel 56 may be switchable via an optional switch 59.

The linearization data are determined by using a linearization data determiner 60. The linearization data determiner 60 comprises the transmission line 32 and the mixer 36 which is connected to the input port 32a and to the output port 32b. The mixer 36 outputs the combined signal 37 via an operational amplifier 62 and an analog-to-digital converter (not shown) to the lookup table 56a.

Below, the method of detecting the calibration data will be described referring to FIG. 5b. The graph 54a illustrates the non-linear ramp of the oscillating signal 12 kept from the input port 32a, while a graph 64a illustrates the ramp of the same oscillating signal 12 kept from the output port 32b of the transmission line 32. As shown, the graph 64a is delayed compared to the graph 54b, wherein the phase difference $\Delta\phi$ between the two signals is dependent on the respective frequency f. Therefore, the phase difference $\Delta\phi$ varies over the time as illustrated by the arrows between the two graphs 64a and 54a (cf. arrows at $t_1$, $t_2$ and $t_3$). The linearization data are selected such that the phase difference $\Delta\phi$ constant over time ($\Delta\phi=k$), as illustrated by the arrow between the two linearized graphs 54b and 64b (cf. arrows at $t_x$). As a consequence of this, the linear ramp 64b is parallel to the linear ramp 54b so that their gradients are equal. In other words, the ramps 54b and 56b are linear and have a constant frequency change ($\Delta f=k$), if the phase change ($\Delta\phi$) is linear over the time.

It should be noted that the connection between the linearization channel 56 and the linearization data determiner 60 is switchable, according to a further embodiment, such that the linearization data determiner 60 may be used just for calibration. According to another embodiment the electrical circuit comprising the linearization channel 56 may be integrated on a single chip.

Referring to FIG. 2a it should be noted that the transmission line 32 may alternatively be terminated with its output 32b such that the control loop 34 is connected to the transmission line just via the input 32a. Here, the first and the second values of the signal parameter of the oscillating signal 12 are detected at the input port 32a.

An alternative (cf. to FIG. 2b) would be that the electrical circuit 30 may comprise an optional divider chain 39 which is connected to the output of the oscillator 18. This optional divider chain 39 serves the purpose of analyzing the oscillating signal 12 or of calibrating the electrical circuit 30.

Referring to FIG. 2b should be noted that the oscillator 18 may comprise an output having a divider (e.g. divider value ½ or 1/N) via which the oscillator 18 is connected to the transmission line 32 in order to reduce the frequency of the oscillating signal 12 if the frequency is too high. Resulting from this, the length of the transmission line 32 may be a fraction of the wavelength of a fraction (e.g. ½ or 1/N) of the oscillating signal 12. Thus, the control loop 34 compares the divided oscillating signal output via the divider of the oscillator 18 with the same signal influenced by the transmission line 32. In this embodiment, the oscillating signal 12 may be output to the mixer 14 as a divided signal via the output having the divider or as a non-divided signal via a further output.

Referring to FIG. 3a it should be noted that the electric circuit 30 may, according to further embodiments, also be used just in combination with the calibration circuit 40, that means without the calibration loop 42. According to a further embodiment (cf. FIG. 3b), the control loop 34 may comprise an operation amplifier 43 between the mixer 36 and the control circuit 38 for amplifying the combined signal 37.

An alternative referring to the embodiment of FIG. 4 would be that the switch 46 may also be arranged between the respective input ports of the transmission lines 33a or 33b and the mixer 36.

Referring to FIG. 5a it should be noted that, according to further embodiments, a transmission line 32 may be used, the length of which is longer than the wavelength, e.g. twice the wavelength of the oscillating signal 12. Background thereof is that the delay introduced by the transmission line 32 on a chip could not be sufficient to make the linearization data determiner 60 sensitive enough to the chirp non-linearity since the maximum delay that should be introduced by a transmission line with a length which is equal to the wavelength (1.2 mm at a frequency of 122 GHz) is very short (e.g. 4 ps). A faster ramp usually takes 10 μs. In order to enlarge this delay a longer transmission line 32 (e.g. 2.4 mm) or delay elements in series to the transmission line 32 would be beneficial with respect to the sensitivity.

Although in the embodiment described above the means for transmitting the oscillating signal 12 are described in the context of a conductive transmission line, it should be noted that also other means for transmitting the oscillating signal, may be used, for example a waveguide. Further, the frequency-determining parameter is not limited to the length of the transmission line. As discussed above, the dielectrics (dielectric constant $\in_R$ and thickness) of the transmission line or another geometry parameter, like the width or the diameter of the waveguide may have a frequency-determining influence.

Although some aspects have been described in the context of an apparatus, it is clear that these aspects also represent a description of the corresponding method for controlling a controllable oscillator, where a block or a device corresponds to a method step or a feature of a method step. Analogously, aspects described in the context of a method step also represent a description of a corresponding block, item or feature of a corresponding apparatus.

The above described embodiments are merely illustrative for the principle of the present invention. It is understood that modifications and variations of the arrangements and the details described herein will be apparent to others skilled in the art. It is the therefore the intent to be limited only by the scope of the pending patent claims and not by the specific details presented by way of description and explanation of the embodiments herein.

What is claimed is:

1. An electrical circuit comprising:
   a controllable oscillator configured to generate an oscillating signal;
   a transmission line connected to an output of the oscillator, the transmission line having a length which is a fraction of a wavelength of the oscillating signal; and
   a control loop configured to detect a difference between a first value of a signal parameter of the oscillating signal and a second value of the signal parameter of the oscillating signal having passed the transmission line, and to control the controllable oscillator in accordance with the difference.

2. The electrical circuit according to claim 1, wherein the first value of the signal parameter is detected at an input port of the transmission line and wherein the second value of the signal parameter is detected at an output port of the transmission line.

3. The electrical circuit according to claim 2, wherein the control loop comprises a mixer, which is connected to the input port and the output port, and configured to combine the oscillating signal tapped from the input port with the oscillating signal tapped from the output port.

4. The electrical circuit according to claim 1, wherein the signal parameter is a phase of the oscillating signal.

5. The electrical circuit according to claim 1, wherein the control loop comprises a control circuit which is configured to output a control signal depending on the difference.

6. The electrical circuit according to claim 5, wherein the control signal is a DC voltage via which the oscillator is controllable.

7. The electrical circuit according to claim 5, wherein the control circuit comprises a low-pass filter and/or a charge pump.

8. The electrical device according to claim 1, which comprises a calibration circuit for calibrating a control signal output to the controllable oscillator.

9. The electrical circuit according to claim 3, which comprises a calibration circuit which is configured to output a calibration signal to the mixer or to a summation circuit of the control loop.

10. The electrical circuit according to claim 9, wherein the calibration circuit comprises:
    a look-up table, in which calibration data are stored; and
    a digital-to-analog converter, which is configured to output the calibration signal to the mixer or a further mixer in accordance with the stored calibration data.

11. An electrical circuit according to claim 1, which comprises a calibration loop for detecting calibration data.

12. The electrical circuit according to claim 11, wherein the calibration loop comprises a frequency divider, a mixer and/or an x-tal reference.

13. The electrical circuit according to claim 1, wherein the transmission line is terminated.

14. The electrical circuit according to claim 3, which comprises:
    a plurality of transmission lines of different lengths connected to an output of the oscillator; and
    a switch which is configured to selectively couple one of the output ports of the transmission lines to the mixer.

15. The electrical circuit according to claim 4, wherein the length of the transmission line is selected such that the phase is shifted by a known value while passing the transmission line with the selected wavelength.

16. The electrical circuit according to claim 1, wherein the fraction amounts to ¼, ½, 1 or 2.

17. The electrical circuit according to claim 1, which comprises a linearization channel having a linearization data determiner and a linearization circuit,
    wherein the linearization data determiner is configured to analyze the difference in order to detect linearization data and to store the linearization data to a further look-up table,
    and wherein the linearization circuit is configured to control the oscillator based on the linearization data.

18. The electrical circuit according to claim 1, wherein the oscillator comprising an output having a divider via which the transmission line is connected.

19. An electrical circuit comprising:
    a controllable oscillator configured to generate an oscillating signal;
    a transmission line connected to an output of the oscillator, the transmission line having a length which is a fraction of a wavelength of the oscillating signal; and
    a control loop comprising a mixer, which is connected to an input port and an output port of the transmission line, and a control circuit;
    wherein the mixer is configured to combine the oscillating signal tapped from the input port with the oscillating signal tapped from the output port such that a difference between a first value of a signal parameter of the oscillating signal and a second value of the signal parameter of the oscillating signal having passed the transmission line is detectable;
    wherein the control circuit is configured to control the controllable oscillator in accordance with the difference via a control signal.

20. An electrical circuit comprising:
    a controllable oscillator configured to generate an oscillating signal;
    a transmission line connected to an output of the oscillator, the transmission line having a length which is a fraction of a wavelength of the oscillating signal;
    a control loop comprising a mixer, which is connected to an input port and an output port of the transmission line, and a control circuit; and
    a calibration circuit comprising a look-up table and a digital-to-analog converter;
    wherein the digital-to-analog converter is configured to output a calibration signal to the mixer in accordance with calibration data stored in the look-up table;
    wherein the mixer is configured to combine the calibration signal, the oscillating signal tapped from the input port and the oscillating signal tapped from the output port such that a difference between a first value of a phase of the oscillating signal and a second value of the phase of the oscillating signal having passed the transmission line is detectable;

wherein the control circuit is configured to control the controllable oscillator in accordance with the difference via a control.

21. An electrical circuit comprising:

a controllable oscillator configured to generate an oscillating signal;

means for transmitting the oscillating signal through a transmission line such that a signal parameter of the oscillating signal is changed; and a control loop configured to detect a difference between a first value of the signal parameter and a second value of the signal parameter, and to control the controllable oscillator in accordance with the difference.

22. The electrical circuit according to claim 21, wherein a parameter of the means for transmitting the oscillating signal is dependent on a wavelength of the oscillation signal.

23. The electrical circuit according to claim 21, wherein the signal parameter is a phase, and wherein the means for transmitting are configured to perform transmission such that a phase shift is caused.

24. A method for controlling a controllable oscillator which is configured to generate an oscillating signal, comprising the steps:

transmitting the oscillating signal through a transmission line which is connected to an output of the oscillator, wherein a length of the transmission line is a fraction of a wavelength of the oscillating signal;

detecting a difference between a first value of a signal parameter of the oscillating signal and a second value of the signal parameter of the oscillating signal having passed the transmission line; and controlling the controllable oscillator in accordance with the difference.

25. The method according to claim 24, wherein the step of controlling the controllable oscillator is performed by using a control signal, and wherein the method comprises the step of calibrating the control signal.

26. The method according to claim 24, which comprises the step of changing the wavelength of the oscillating signal by transmitting the oscillating signal through a further transmission line of a different length.

* * * * *